United States Patent [19]

Imhoff et al.

[11] 4,008,468
[45] Feb. 15, 1977

[54] ANALOGUE-TO-DIGITAL CONVERTER WITH CONTROLLED ANALOGUE SETTING

[75] Inventors: Claude Imhoff; Jean Marie Aure, both of Paris, France

[73] Assignee: Thomson-CSF, Paris, France

[22] Filed: Mar. 12, 1975

[21] Appl. No.: 557,478

[30] Foreign Application Priority Data

Mar. 15, 1974 France .............................. 74.08883

[52] U.S. Cl. ........................ 340/347 AD; 324/99 D
[51] Int. Cl.[2] ........................................ H03K 13/02
[58] Field of Search ............... 340/347 AD, 347 CC

[56] References Cited

UNITED STATES PATENTS

| | | | |
|---|---|---|---|
| 3,597,761 | 8/1971 | Fraschilla et al. | 340/347 AD |
| 3,798,637 | 3/1974 | Fruhauf | 340/347 AD |
| 3,846,786 | 11/1974 | Brown et al. | 340/347 AD |

*Primary Examiner*—Thomas J. Sloyan
*Attorney, Agent, or Firm*—Karl F. Ross; Herbert Dubno

[57] ABSTRACT

A precision and high-speed analogue-to-digital converter has two separate groups of comparators linked by an intermediate network comprising a digital-to-analogue converter made up of current generators which are controlled by the logical outputs from the first group of comparators. These outputs represent the higher-order bits of the digital equivalent of the analogue input signal which is transmitted to the second group of comparators via a delay line. The digital-to-analogue converter causes a change in the threshold voltages applied to the comparators in the second group, which supply the lower-order digits of the coded input signal. The linking network further comprises means to compensate for errors at the inputs of the second group of comparators due to variations in the biasing currents of its comparators and also in the setting of their thresholds.

10 Claims, 6 Drawing Figures

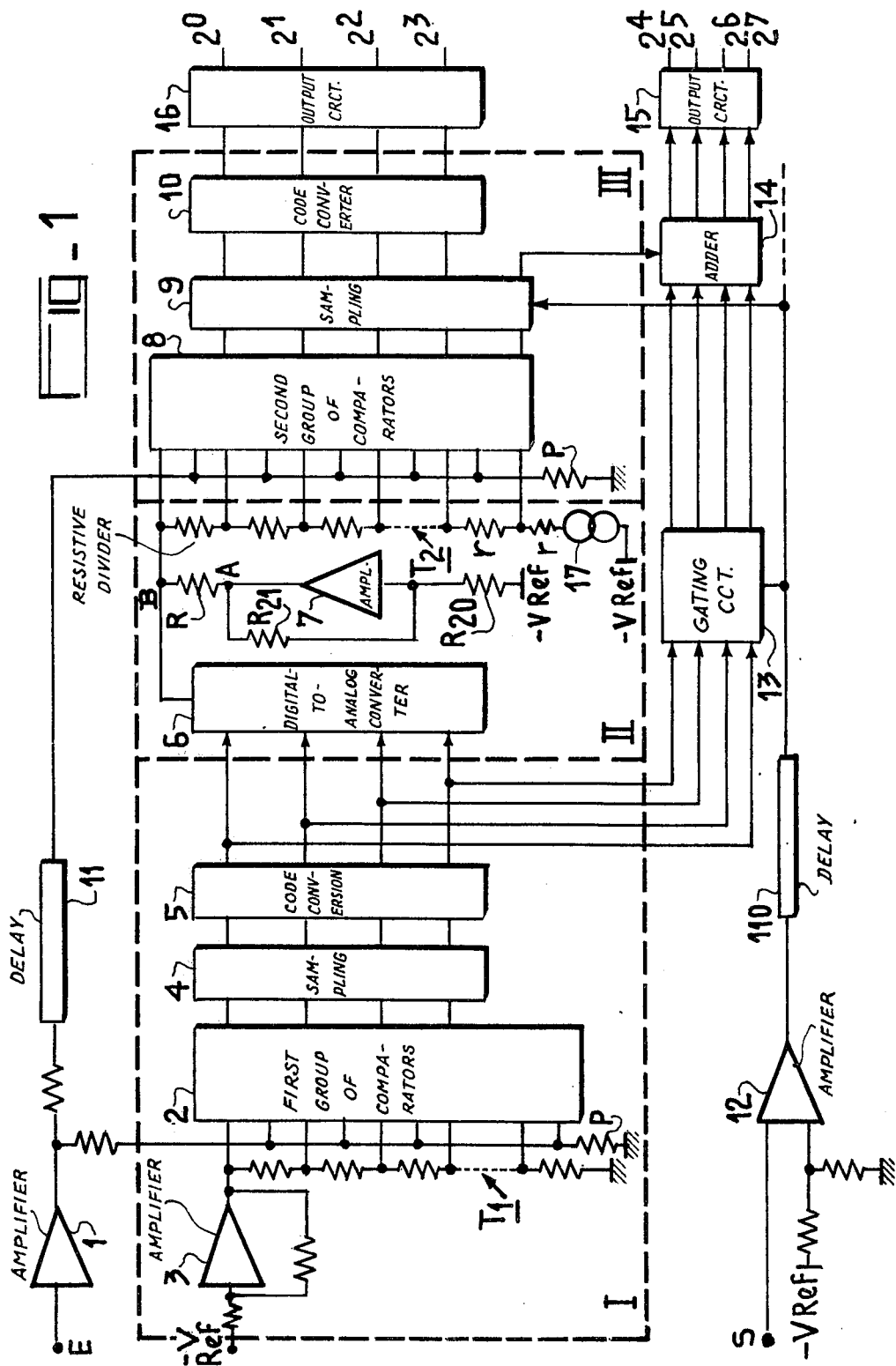

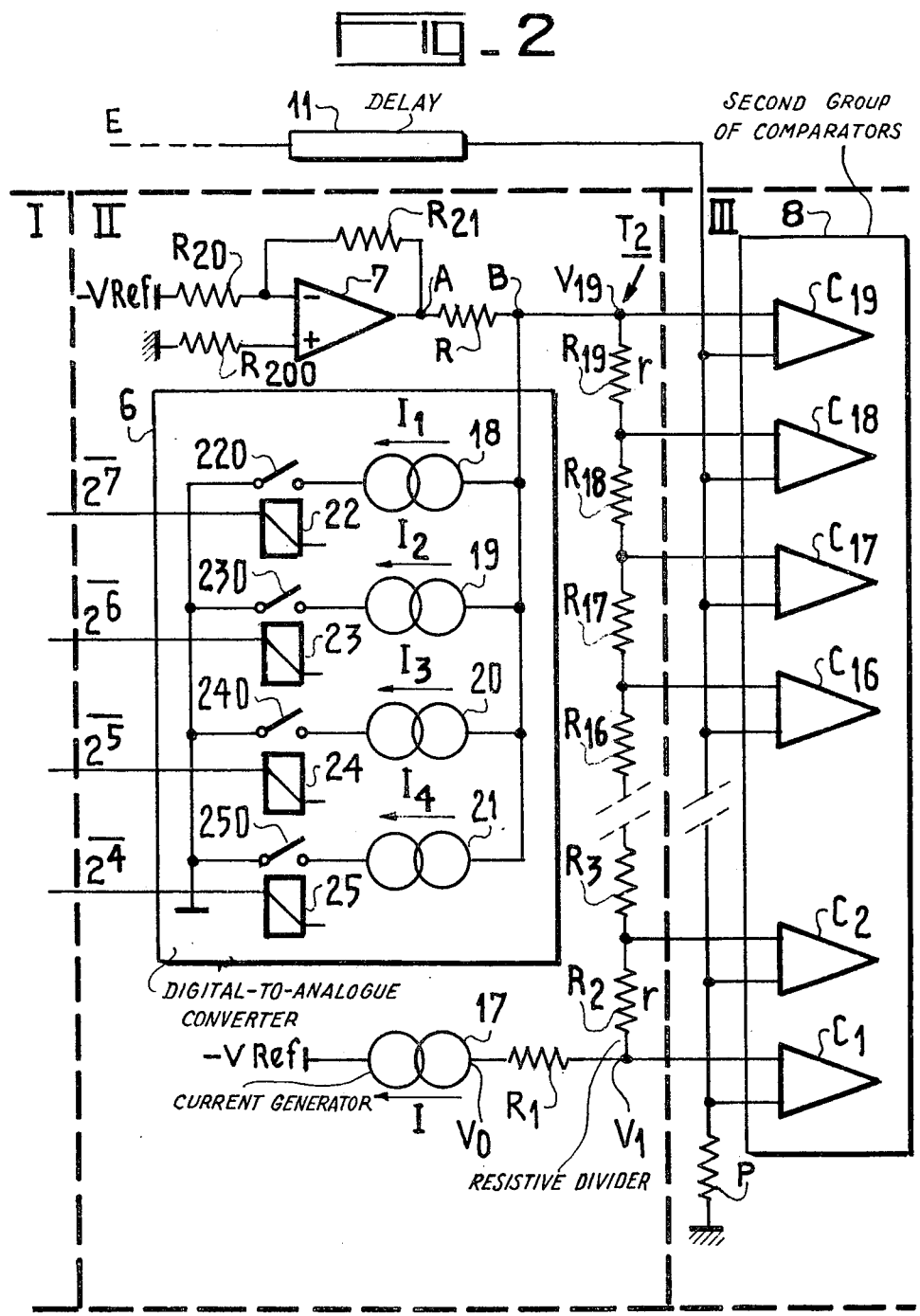

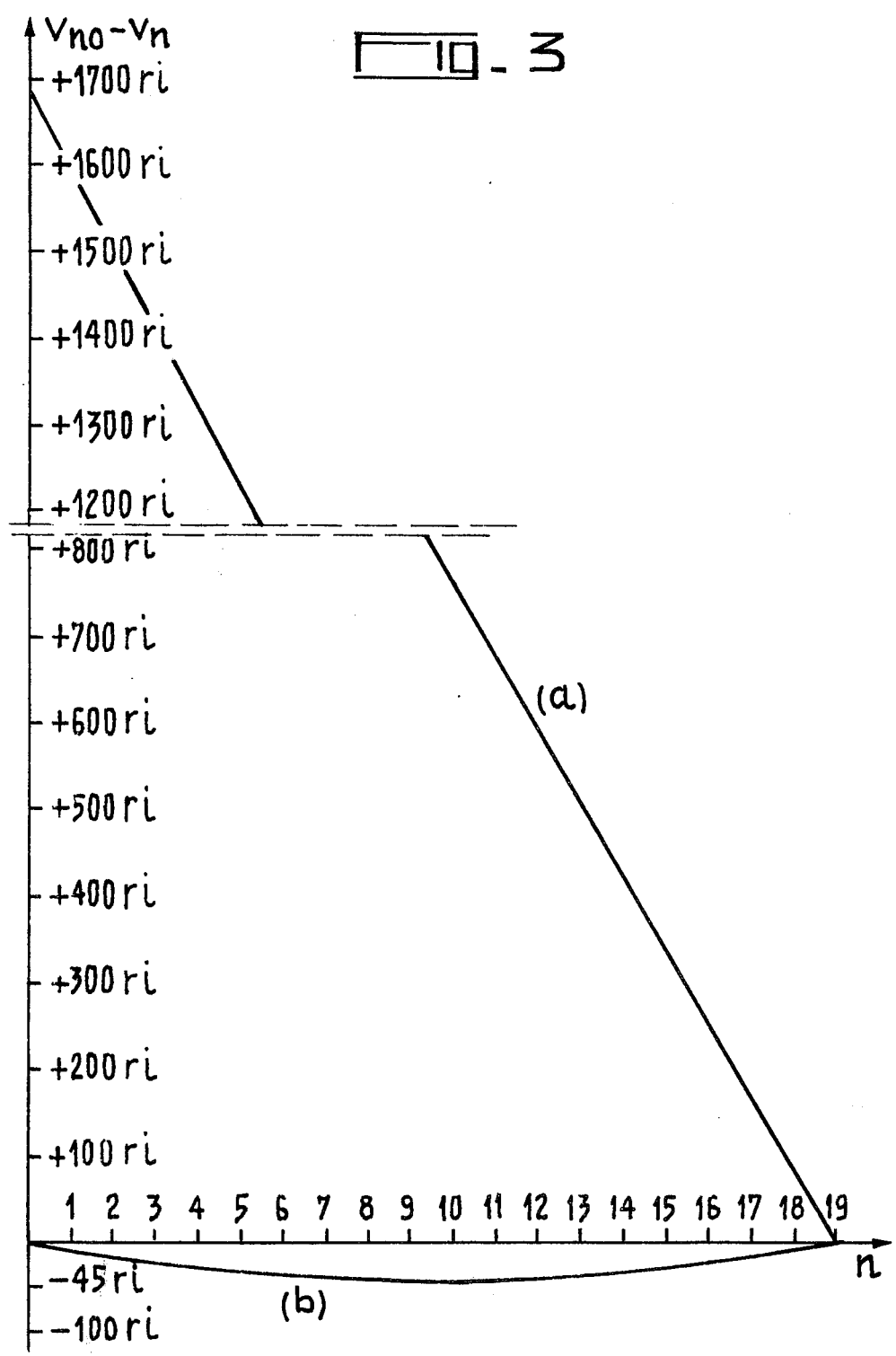

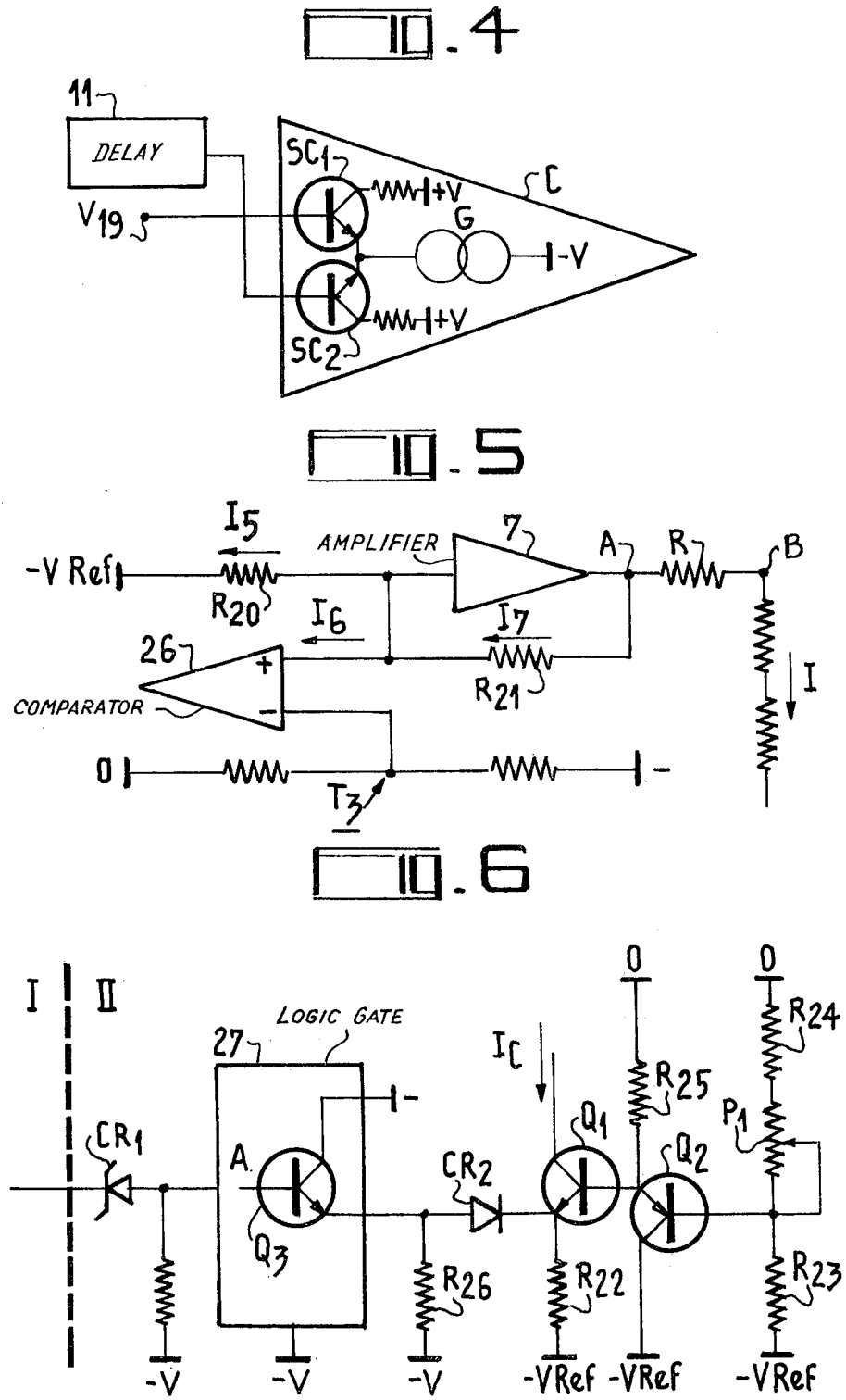

ANALOGUE-TO-DIGITAL CONVERTER WITH CONTROLLED ANALOGUE SETTING

BACKGROUND OF THE INVENTION

The present invention relates to an analogue-to-digital converter of the series-parallel type with controlled analogue setting. The analogue-to-digital conversion is carried out conventionally by using threshold comparators to which the input signal, represented by a voltage, is applied. Normally the thresholds of the various comparators are set at regularly graduated voltages by means of a resistive network to which a reference voltage is applied. Depending on whether or not the analogue input voltage is greater than the threshold voltage with which it is compared, the bit obtained at the output is a logical 1 or a logical 0.

When using a purely parallel method of conversion, it is clear that to code a signal with a certain accuracy, for example to give an eight-bit coding, a fairly large number of comparators (about 255) are required. To save on comparators, the encoder is generally constructed in two parts establishing two groups of comparators which both operate on the same principle, with a first part supplying the higher-order or more significant bits whereas the second part supplies the lower-order or less significant bits. However, with this type of arrangement it is necessary to provide a link between the two parts of the encoder since the incoming analogue signal needs to act on both parts of the encoder, i.e. on both groups of comparators, but the way in which the second part operates is related to the result of the coding operation performed by the first part.

In prior-art systems, the link between the two parts of the encoder is formed by an operational amplifier which subtracts the already coded signal, i.e. the one which produced the higher-order bits, from the input signal so as to provide an input voltage for the comparators in the second part.

Also, the analogue signal which is to be applied to the second part of the encoder is delayed by passing it through so-called sampling gates. However, these sampling gates have to meet two conflicting requirements. The coding needs to be performed both quickly and accurately, but if accuracy is required it slows down the operation of the gates, quite apart from the matter of their cost.

OBJECT AND SUMMARY OF THE INVENTION

Thus, in a preferred field of application of the invention, namely the coding of a television signal with the object of altering it by adding to it or removing from it certain components so as to improve its general quality, it is difficult, when using sampling gates and while ensuring an accuracy of the order of eight bits, to achieve the coding speed which is necessary to handle a signal whose pass band is of the order of 6 MHz, that speed calling for a corresponding sampling frequency of the order of 15 to 25 MHz.

The principal object of our present invention is to solve the above problem by establishing a link between the two parts of the encoder which allows operations to take place at the requisite speed.

Let us consider an encoder, designed to convert analogue input voltages into combinations of bits, which is divided — like the conventional encoders referred to above — into two sections including respective groups of comparators each having a test input and a reference input. The reference inputs of the first group of comparators are connected to a source of first threshold voltages, specifically a potentiometer, separated by relatively large increments $\Delta V1$; the reference inputs of the second group of comparators are similarly connected to a source of second threshold voltages, separated by relatively small increments $\Delta V2$. An analogue input voltage to be digitized is fed by first circuit means in parallel to the test inputs of all the comparators of the first group, causing them to generate a set of higher-order bits in an output of the first encoder section; the same input voltage is fed in parallel, by second circuit means which may include a delay line, to the test inputs of all the comparators of the second group for causing the generation of a set of lower-order bits in an output of the second encoder section.

We have found that significant threshold errors are introduced in the second encoder section, generating the lower-order bits, by the biasing currents drawn by its encoders. In the unswitched state of a comparator, such a biasing current flows in its reference input; when the comparator changes to its switched state, in response to a predetermined relationship between the voltages on its two inputs, the flow of biasing current shifts to its test input. These biasing currents also pass through a resistive voltage divider serving as the source of threshold voltages of either encoder section; in the first section, however, the resulting threshold errors may be considered negligible.

An improved encoder according to our invention, designed to reduce this threshold error, comprises a fixed resistor R connected in series with the resistive voltage divider of its second section across a constant-current generator. The voltage divider consists of $p$ segments of resistance $r$ (generally smaller than R) forming $p$ junctions with one another and with the resistor R, these junctions being respectively connected to the reference inputs of the comparators of the second group. A control network connected to the output of the first encoder section, including digital-to-analogue conversion means, lies in series with the fixed resistor R only for concurrently shifting the threshold voltages of these comparators, in response to the generated higher-order bits, by modifying the voltage drop across resistor R by multiples of $\Delta V1$ in order to hold the analogue input voltage applied to the second encoder section within the operating ranges of its comparators. The constant-current generator delivers a current $I$ which is less than a current $Io$ required to make the total voltage drop $prI$ across the voltage divider equal to $\Delta V1$, the difference $Io - I$ substantially compensating for the aforementioned threshold errors.

Advantageously, as will be shown hereinafter, the difference $Io - I$ is made substantially equal to $(k + R/r)$ where $k$ is an integer close to $p/2$; $p$, the number of second-group comparators, should be larger than $2^m$ where $m$ is the number of lower-order bits generated in the second encoder section. With $m = 4$, for example, $p$ may be equal to 19; in that case, $k$ may be 9.

BRIEF DESCRIPTION OF THE DRAWING

The above and further features of our invention will now be described in detail with reference to the accompanying drawing in which:

FIG. 1 is a block diagram of an analogue-to-digital converter embodying our present invention;

FIG. 2 is a block diagram of an intermediate network linking two groups of comparators in the converter of FIG. 1;

FIG. 3 is a graph showing the magnitude, before and after compensation, of the error produced by the currents which are drawn by the inputs of the comparators;

FIG. 4 is a circuit diagram of a detail of a comparator of the second group;

FIG. 5 is a block diagram of a device for compensating for the input currents of the comparators in dependence upon temperature; and FIG. 6 is a circuit diagram of a current generator used in the arrangement in FIG. 2.

DETAILED DESCRIPTION OF A PREFERRED EMBODIMENT

Our improved analogue-to-digital converter particularly described hereinafter codes analogue signals with a degree of accuracy inherent in the use of eight bits, obtained in two stages per conversion cycle. This converter or encoder accordingly, includes two groups of high-speed comparators.

It should be noted, however, that the division of the comparators into two groups is not critical. Depending on the accuracy required, the converter may be divided into a greater number of parts, such as three. Accuracy would thereby be improved but the sampling speed would tend to fall.

Thus, the converter shown in FIG. 1 has three main parts. A first part I includes a first group of comparators 2 and associated circuits responsible for coding the analogue input voltage which appears at E and which is transmitted through an operational amplifier 1, this part I supplying the higher-order bits. A second part II is an intermediate network which links part I with part III and weights the thresholds of a second group of comparators 8 in the latter part, in response to these higher-order bits, to give the lower order bits. The first group 2 of comparators, numbering about 15, receive the analogue input signal via the wide passband operational amplifier 1 having a high output current. The signal developed across a resistance P, is attenuated in a 1:2 ratio and is applied to the inputs of the fifteen comparators of this group in parallel. These comparators have second, or threshold, inputs energized by voltages that are regularly graduated in uniform steps by means of a resistive network T1, to which is applied a reference voltage VRef via an operational feedback amplifier 3.

To avoid random coding faults, the code used is a reflected or Gray code which allows the output information from the 15 comparators to be obtained as four higher-order digits. This makes it necessary to have, downstream of the comparators, a stage 4 where logical sampling takes place, and a code-conversion stage 5 which converts the Gray-coded results into binary form and whose four outputs (one per bit) are connected to a weighting unit in part II comprising a digital-to-analogue converter 6. In this part II, which will be described in greater detail hereinafter with reference to FIG. 2, the values of the threshold voltages to be applied to the second group 8 of comparators contained in part III are modified according to the results of the first coding operation.

The number of comparators in group 8, within part III, should theoretically equal the number of comparators in the first group 2, i.e. 15. In actual fact, however, there are nineteen such comparators in part III so that the two codings can be cross-checked and so that, if need be, errors occurring in the first group 2 may be corrected with the help of the second group 8. As in the case of the first group, the threshold inputs of the comparators in the second group are energized by voltages in regular steps by means of a resistive network T2.

Let us consider the voltage difference which exists between the threshold inputs of two successive comparators. In the case of the first group the difference is $$\Delta V1 = \tfrac{1}{2} \frac{\text{maximum signal } V}{16}$$

whereas in the case of the second group it is $$\Delta V2 = \tfrac{1}{2} \frac{\text{maximum signal } V}{256} = \frac{\Delta V1}{16}.$$

As regards the other inputs of the 19 comparators in the second group, they are fed with the analogue input signal after it has been attenuated in the ratio 1:2 and has been delayed in a delay line 11 by a period equaling the duration of the operations which are performed in the first part I of the converter.

As in the case of the first part, the output information from the 19 comparators 8 is coded in the form of five Gray digits in a sampling circuit 9 under the control of a sampling pulse which comes from a source S via a high-speed comparator 12 and is delayed in a delay line 110. This line produces a delay equal to that applied by the delay line 11 through which passes the analogue signal to be coded. Of the five Gray digits supplied in this way by the sampling circuit 9, four represent the lower-order bits of the binary equivalent of the analogue input signal and the fifth represents any error which occurred in the first group of comparators. This fifth digit is applied, simultaneously with the four higher-order digits passing through a gating circuit 13, to an adder 14 connected to an output circuit 15 which gives the higher-order bits as corrected. The four digits from sampling circuit 9 are applied to a code converter 10 which feeds to an output circuit 16 the four lower-order bits derived from the analogue input signal.

It will be noted that, to correct any sampling errors which may have occurred in the first group, the voltage which is applied to the threshold input of the first comparator in the first group 2 is fractionally larger than the difference $\Delta V1$ defined above. The voltage applied to it is $\Delta V1 + 2\Delta V2$, thus allowing the second group to correct an error of two significant incremental units ($2\Delta V2$), up or down, which occurs during the first coding.

FIG. 2 shows details of the weighting network of part II including the digital-to-analogue converter 6, connected to the output of an operational amplifier 7 with feedback resistor R21 whose inverting input receives via a resistor R20 the reference voltage-VRef, its non-inverting input being grounded through a resistor R200. The output A of the operational amplifier 7 energizes, in parallel with converter 6, the voltage divider T2, consisting of nineteen resistors R1 to R19 whose terminals represent the threshold inputs of the 19 comparators C1 to C19 which make up group 8. The values of the resistors are generally made equal to a predetermined magnitude $r$. The resistive divider is supplied by a generator 17 which delivers a constant current I. In this way the current creates in each resistor of the divider a potential difference rI equal to the value of a significant incremental unit ΔV2. Thus the threshold inputs of each of the 19 comparators C1 to C19 differ from one another by regularly graduated voltages representing the value of one incremental unit. The voltage at the upper end B of the resistive divider, i.e. at the input terminal of resistor R19, is determined by operational amplifier 7, which is supplied by the source of reference voltage -VRef and feeds a resistor R in series with divider T2. Voltage -VRef is sufficiently negative to establish the threshold voltage V1 of comparator C1 at the desired incremental level ΔV2, taking into account the voltage drop due to current I developed across the internal resistance of generator 17. Since the same reference voltage -VRef is applied to the inverting terminal of amplifier 7, current I also passes through the resistor R20.

The digital-to-analogue converter 6 consists mainly of four current generators 18, 19, 20 and 21 which emit currents $I_1$, $I_2$, $I_3$ and $I_4$ respectively, the ratio of these currents corresponding to a binary progression, i.e. $I_1:I_2:I_3:I_4 = 8:4:2:1$.

These four current generators are controlled by the state of the four higher-order digits of ranks $2^7$, $2^6$, $2^5$, and $2^4$ supplied by the circuit 5 (FIG. 1) located in the first part I of the encoder. It will be noted that for practical reasons it is the complemented values of these digits which are utilized; in the example described they control analogue switches 220, 230, 240, 250.

When the current generators 18 to 21 are on, the currents they supply flow through the resistor R which is connected to the output of amplifier 7, where they create a potential difference which is a direct function of the four higher-order bits derived from the analogue input voltage E to be coded. This latter voltage is applied to that test inputs of the comparators via delay line 11.

As regards the operation of this digital-to-analogue converter, the voltage VA at point A is held constant by operational amplifier 7 whence:

$$VA = VRef \frac{R21}{R20} \qquad (1)$$

On the other hand, the voltage VB at point B depends on the values of the currents from generators 18 to 21 and it can be shown that:

$$VB = VA - RI - R(I_1 + I_2 + I_3 + I_4) \qquad (2)$$

Since R and I are constants, as is VA, the value of the voltage at point B depends only on the currents which are controlled by the higher-order digits.

It is therefore possible to determine the magnitude of the voltage at point B when one of the current generators 18 to 21 is active, i.e. when the digit controlling it is at logical 0 (since it is the complemented values which are here involved).

When none of the current generators has been actuated, voltage VB is at its maximum value, this being equal to the value of the analogue input signal (i.e. 256ΔV2) based on the value of the difference ΔV2, which is increased by three incremental units to compensate for any error which may have occurred in the first group of comparators. Thus, $$VB\text{max} = VA - RI = (256 + 3)\Delta V2 = 259\Delta V2$$

When the current which corresponds to the most significant digit $2^7$ is the only one present, i.e. $2^7 = 0$, the value of VB becomes $$VB1 = VA - RI - RI_1 = (128 + 3)\Delta V2 = 131\Delta V2;$$

and so on in succession for current $I_2$ alone present ($2^6 = 0$), current $I_3$ alone present ($2^5 = 0$), and current $I_4$ alone present ($2^4 = 0$), giving:

$$VB2 = 195\Delta V2$$

$$VB3 = 227\Delta V2$$

$$VB4 = 243\Delta V2$$

Thus, the voltage at the upper end B of the resistive divider, varying as it does as a function of the first four digits derived from the input signal to be coded, causes a shift in the absolute value of the voltage which is applied to the reference or threshold input of each comparator in the second group 8. The operation of deriving the lower-order digits from the signal to be coded by means of this second group 8 of comparators is thus properly performed with allowance being made for the higher-order digits.

However, the currents drawn by the inputs of the comparators in group 8, corresponding to the differences which exist between the biasing currents traversing the two semiconductor components in the differential input stage of any comparator when it is switched over, flow in the resistive divider T2 (R1 to R19) and give rise in it to potential differences which would manifest themselves as errors in the threshold voltages unless corrected in accordance with our invention. FIG. 4 depicts a comparator C of the second group (representative of elements C1 – C19) with its input differential circuit shown in schematic form. It comprises two semiconductor elements SC1 and SC2, specifically NPN transistors. The base of the first transistor SC1 is connected to the upper end of the resistive divider T2 (FIG. 2) via resistors R2 to R19 in accordance with the ordinal position of the considered comparator. The base of the second transistor SC2 is connected to the output of delay line 11. The collector electrodes of both transistors are connected to a reference-voltage source +V and their emitters are both connected to a current generator G. If a quiescent current $i$ (assumed to be constant for all the comparators) is drawn from divider T2 by each unswitched comparator, resistors R1 to R19 being each of magnitude $r$ as noted above, it is possible to define the voltage drop at the terminal of each resistor R1 to R19, for each of the comparators not switched over, as $V1_{min} - V0_{min} = rI$ at the terminals of R1
$V2_{min} - V1_{min} = r(I+i)$ at the terminals of R2
$V19_{min} - V18_{min} = r(I+18i)$ at the terminals of R19,
with $V19_{min} = VB_{min}$. Adding each side of these equations gives:

$$V19_{min} - V0_{min} = 19\ rI + ri\ (1+2+3\ldots+18) = 19\ rI + 171ri \qquad (3)$$

$$V19_{min} = VB_{min} = VA - RI - 19\ Ri \qquad (4)$$

It will thus be seen that the existence of these quiescent currents at the inputs of the comparators may possibly cause a considerable error in the thresholds.

In accordance with the invention the major part of this error is compensated by artifically shifting the voltage VA, which is assumed to be constant, at the output of operational amplifier 7 and by adjusting the current I to a value different from the theoretical value Io given by the equation $$Io = \frac{\Delta V2}{r}.$$

Thus as the comparators switch over with rising signal, the voltage at point B will vary until it reaches the desired value $259\Delta V2$, at which point all the comparators will have switched.

From equations 3 and 4 it can be seen that:

$$VB_{min} = VO_{min} + 19\ rI + 171\ ri = VA - RI - 19\ Ri$$

and therefore $$VA = VO_{min} + I(19r + R) + i\ (171r + 19R) \qquad (5)$$

Taking the case where all the comparators have switched over and their input currents are therefore drawn from the signal path including delay line 11, the following equations hold:

$$VB_{max} = VA - RI$$

or $$VA = VB_{max} + RI \qquad (6)$$

From equations (5) and (6) it follows that:

$$VB_{max} - VO_{min} = 19rI + (171r + 19R)i \qquad (7)$$

Now, $VB_{max} - VO_{min}$ should be equal to the theoretical value of the potential difference at the terminals of the resistive divider, namely $19\Delta V2$; we can therefore write $$19\Delta V2 = 19rI + i(171r + 19R)$$

whence $$I = \frac{\Delta V2}{r} - i\left(9 + \frac{R}{r}\right)$$

with $\Delta V2/r$ representing the theoretical value Io of current I. In accordance with the invention, compensating for the threshold error establishes the value of the anticipated current I, i.e.

$$I = Io - i\left(9 + \frac{R}{r}\right) \qquad (8)$$

From this can be extracted the value of the voltage VA, which is given by equation (6), i.e.

$$VA = VB_{max} + R\left[Io - i\left(9 + \frac{R}{r}\right)\right] \qquad (9)$$

From the foregoing equations it is possible to calculate the voltage Vn at any point along the divider at the moment when the corresponding comparator switches over, n representing the position of the particular comparator.

The value in question is:

$$Vn = VA - I\ [R + (19 - n)r] - (19 - n)i\left[R + \left(\frac{18 - n}{2}\right)r\right] \qquad (10)$$

After various simple conversions and using the theoretical value of Vn (i.e. $Vno$), there is obtained:

$$Vno - Vn = -\frac{n}{2}(19 - n)ri$$

A maximum is achieved when $$-\frac{1}{2}(19 - n) + \frac{n}{2} = 0$$

or $$n = \frac{19}{2}$$

From this it can be deduced that the maximum setting error is reached in the case of thresholds of the comparators in ordinal positions 9 and 10; the value of the error is:

$$Vno - Vn = -45\ ri.$$

A calculation of a similar kind allows the threshold errors to be determined when there is no compensation for the quiescent currents at the comparator inputs. At the moment when a comparator switches over, the voltage at the corresponding point n along the resistive divider T2 is given by equation (10).

By inserting also the theoretical value $Vno1$ of the voltage at the point in question, i.e.

$$Vno1 = VA - I\ [R + (19 - n)\ r],$$

equation (10) becomes:

$$Vn = Vno1 - (19 - n)\ i\left[R + \frac{(18 - n)}{2}r\right]$$

whence $$Vno1 - Vn = (19 - n)\ i\left[R + \frac{(18 - n)}{2}r\right] \qquad (11)$$

from which may be found the error as a function of n. The minimum value for this equation exists when $R/r + 37/2 = n$, the error given thereby being:

$$Vno1 - Vn = -\frac{ri}{2}\left(\frac{R}{r} - \frac{1}{2}\right)2$$

which is zero when:
n = 19 and $$n = \frac{2R}{r} + 18$$

FIG. 3 shows the error caused by the shift in the input currents of the comparators as a function of the ordinal position of the comparators, before (curve a) and after (curve b) compensation.

In accordance with the invention it is also possible to compensate for changes in the biasing current for the comparators which occur as a function of temperature. It was assumed in the foregoing that the biasing currents were constant and that the only factor involved was the difference between the currents corresponding to the two inputs.

Since the source impedances on the reference and signal sides are different, any alteration in the biasing currents, especially as a result of temperature, causes an error in the thresholds for the second group 8 of comparators. This alteration must be compensated so as to maintain the accuracy of the converter with regard to temperature.

To obtain a constant voltage VB, voltage VA is varied in the same pattern as VB but in the opposite direction.

FIG. 5 shows the circuit which is used when the biasing current $I_6$ for a comparator 26 is utilized in setting the voltage VA at point A, i.e. at the output of operational amplifier 7. Comparator 26 has a noninverting input connected to the junction of resistors R20, R21 and an inverting input tied to a tap on a voltage divider T3.

Assuming amplifier 7 to be an ideal amplifier, it can be shown that $$I_5 = \frac{VRef}{R20} \text{ and } I_7 = I_5 + I_6$$

whence $$VA = R21 \cdot I_7 = R21 (I_5 + I_6) = \frac{R21}{R20} VRef + R21 \cdot I_6$$

and $$VA = \frac{R21}{R20} VRef + R21 \cdot I_6$$

Voltage VA depends on the biasing current $I_6$ for comparator 26 and on temperature. Changes in this current will be reflected by a corresponding change in VA. The change is adjusted by altering the value of resistor R21.

FIG. 6 shows a current generator which is used in the digital-to-analogue converter 6 of the control network II, this converter being operable at a high sampling frequency of the order of 15 MHz or more.

Such a generator is formed by a logic gate 27 which has a semiconductor component Q3 in the form of NPN transistor at its output, the conductive state of that transistor being controlled by a logic output of the first part I of the coder via a Zener diode CR1. The emitter of transistor Q3 is connected to the emitter of a semiconductor component Q1 also an NPN transistor via a diode CR2. The base of component Q1 is connected to the emitter of a component Q2 in the form of an NPN transistor whose base is held at a predetermined voltage by a resistive divider R23, P1, R24, transistor Q2 having an emitter resistor R25. The way in which this generator operates will not be described in detail. It will, however, be noted that the high-speed diode CR2 inserted between semiconductor components Q1 and Q3 allows logic gate 27, which has to handle a high current, exceeding that produced in transistor Q1 by the current generator, to operate normally. Under these conditions, collector current Ic would be to high and in view of the low value of $\Delta V2$ (5 mV) the value of resistors r would be much too low. Diode CR2 separates the currents of transistors Q1 and Q3.

It will also be noted that the semiconductor components Q1 and Q2 are of complementary types and are connected cascade. This allows the base/emitter voltage to be compensated as a function of temperature. However, there is also compensation for changes in the current gains of the transistors, which give rise to changes in the collector currents. This is achieved by making the value of the resistor R22, inserted in the emitter lead of component Q1 equal to half the geometric mean of the resistors R23, R24 according to expression:

$$R22 = \frac{R23 \cdot R24}{R23 + R24}$$

What is claimed is:

1. A high-speed encoder of the series-parallel type for converting analogue input voltages into combinations of bits, comprising:
   a first and a second encoder section respectively including a first group of comparators and a second group of comparators each having a test input and a reference input;
   a source of first threshold voltages, separated by relatively large increments $\Delta V1$, respectively applied to the reference inputs of said first group of comparators;
   a source of second threshold voltages, separated by relatively small increments $\Delta V2$, respectively applied to the reference inputs of said second group of comparators;
   first circuit means for feeding an analogue input voltage in parallel to the test inputs of all the comparators of said first group with resulting generation of a set of higher-order bits in an output of said first encoder section;
   second circuit means for feeding said analogue input voltage in parallel and with a predetermined delay to the test inputs of all the comparators of said second group with resulting generation of a set of lower-order bits in an output of said second encoder section, each comparator of said second group responding to a predetermined relationship between the voltages on its test and reference inputs by changing from an unswitched state with flow of biasing current in its reference input to a switched state with flow of biasing current in its test input; and a control network including digital-to-analogue conversion means connected to the output of said first encoder section for concurrently shifting said second threshold voltages in response to said higher-order bits to hold said analogue input voltage within the operating ranges of said second group of comparators, said source of second threshold voltages including a resistive voltage divider connected in series with a fixed resistor R across a constant-current generator and consisting of $p$ segments of resistance $r$ forming $p$ junctions with one another and with said fixed resistor, $p$ being the number of comparators in said second group, said junctions being respectively connected to the reference inputs of the comparators of said second group, said control network being in series with said fixed resistor only for modifying the voltage drop thereacross by multiples of $\Delta V1$, the current I delivered by said generator being less than a current Io required to make the total voltage drop $pr$I across said voltage divider equal to $\Delta V1$, the difference Io − I substantially compensating for threshold errors due to said biasing currents.

2. An encoder as defined in claim 1 wherein $R > r$.

3. An encoder as defined in claim 1 wherein Io − I is substantially equal to $(k + R/r)$ where $k$ is an integer close to $p/2$.

4. An encoder as defined in claim 3 wherein $p = 19$ and $k = 9$.

5. An encoder as defined in claim 1 wherein the number of said lower-order bits is $m$, $p$ being larger than $2^m$.

6. An encoder as defined in claim 1 wherein the lowest of said first threshold voltages is fractionally larger than $\Delta V1$.

7. An encoder as defined in claim 1 wherein said source of second threshold voltages further includes an operational amplifier in series with said fixed resistor.

8. An encoder as defined in claim 7 wherein said source of second threshold voltages further includes a temperature-compensating network comprising a comparator with a noninverting input of said operational amplifier and with an inverting input held at a fixed reference potential.

9. An encoder as defined in claim 1 wherein said control network comprises a plurality of current sources with switches connected to respective output leads of said first encoder section carrying said higher-order bits, each of said current sources including a gating transistor provided with an input connection containing a Zener diode and further provided with an output resistor, a first ancillary transistor of one conductive type inserted between said fixed resistor R and said output resistor, and a second ancillary transistor of the opposite conductivity type in an input circuit of said first ancillary transistor, said second ancillary transistor having a biasing lead connected to a tap of a potentiometer.

10. An encoder as defined in claim 9 wherein said output resistor has a magnitude substantially equaling half the geometric mean of the values of the portions of said potentiometer separated by said tap.

* * * * *